United States Patent
Waki et al.

(10) Patent No.: US 7,635,877 B2
(45) Date of Patent: Dec. 22, 2009

(54) NITRIDE SEMICONDUCTOR DEVICE AND MANUFACTURING METHOD THEREOF

(75) Inventors: Eiji Waki, Kamifukuoka (JP); Atsushi Nakagawa, Kamifukuoka (JP)

(73) Assignee: New Japan Radio Co., Ltd., Tokyo-to (JP)

( * ) Notice: Subject to any disclaimer, the term of this patent is extended or adjusted under 35 U.S.C. 154(b) by 0 days.

(21) Appl. No.: 11/110,721

(22) Filed: Apr. 21, 2005

(65) Prior Publication Data

US 2005/0236646 A1    Oct. 27, 2005

(30) Foreign Application Priority Data

Apr. 21, 2004    (JP)    .............. 2004-125321

(51) Int. Cl.
*H01L 29/778*    (2006.01)
(52) U.S. Cl. .............. 257/194; 257/192; 257/E29.246; 257/E29.253
(58) Field of Classification Search .......... 257/192, 257/194, 472, E29.149, 201, E29.148, E29.246, 257/E29.248, E21.387, E29.252, E29.253, 257/E21.407, E29.249; 438/167, 172
See application file for complete search history.

(56) References Cited

U.S. PATENT DOCUMENTS

| | | | | |
|---|---|---|---|---|
| 5,796,132 A * | 8/1998 | Nakano et al. | .............. | 257/284 |
| 6,492,669 B2 * | 12/2002 | Nakayama et al. | .......... | 257/282 |
| 6,552,373 B2 * | 4/2003 | Ando et al. | .................. | 257/192 |
| 6,787,820 B2 * | 9/2004 | Inoue et al. | ................. | 257/192 |
| 2003/0203604 A1 * | 10/2003 | Makita | ......................... | 438/571 |
| 2004/0155260 A1 * | 8/2004 | Kuzmik | ...................... | 257/192 |
| 2005/0258451 A1 * | 11/2005 | Saxler et al. | ................ | 257/192 |
| 2006/0006413 A1 * | 1/2006 | Beach | ......................... | 257/192 |

FOREIGN PATENT DOCUMENTS

JP    10-335637    12/1998

OTHER PUBLICATIONS

Lee et al. Characterization of GaN Schottky barrier photodetectors with a low-temperatrue GaN cap layer. Journal of Applied Physics. vol. 94, No. 3. (2003).*
Y. Ohno, et al.; "International Conference on Nitride Semiconductor, Nara, 2003, Tu-P2.067" (p. 375).
The World Book Dictionary(A Thorndike-Barnhart Dictionary); vol. one A-K; Clarence L. Barnhart and Robert K. Barnhart; pp. 1-3, 1981.
Renaissance and Progress in Nitride Semiconductors; Isamu Akasaki; IPAP Conf. Series 1 pp. 1-6.

* cited by examiner

*Primary Examiner*—Allan R. Wilson
(74) *Attorney, Agent, or Firm*—Antonelli, Terry, Stout & Kraus, LLP.

(57) ABSTRACT

A nitride semiconductor device including an ohmic electrode with low contact resistance and manufacturing method thereof including a first nitride semiconductor layer made of a III-V group nitride semiconductor layer deposited on a substrate, a second nitride semiconductor layer including the III-V group nitride semiconductor layer whose film formation temperature is lower than that of the first nitride semiconductor layer and being deposited on the first nitride semiconductor layer and not including aluminum. An ohmic electrode is then formed through forming a metal pattern making ohmic contact on the second nitride semiconductor layer being unprocessed crystallinity with minute grains, and then heat treating the metal pattern.

5 Claims, 3 Drawing Sheets

NITRIDE SEMICONDUCTOR DEVICE AND MANUFACTURING METHOD THEREOF

BACKGROUND OF THE INVENTION

The present invention relates to a nitride semiconductor device where a nitride semiconductor is used as an active layer and a manufacturing method for the same, and in particular, to a nitride semiconductor device having an ohmic electrode that makes ohmic contact with the semiconductor device, such as a high electron mobility transistor (HEMT) and a field effect transistor (FET), and a manufacturing method thereof.

FIG. 4 is a cross sectional diagram of a semiconductor device made of a conventional III-V group nitride semiconductor. The semiconductor device shown in FIG. 4 has a so-called HEMT structure where a buffer layer 102 made of gallium nitride (GaN), a channel layer 103 made of gallium nitride, a charge supply layer 104 made of n type aluminum gallium nitride (AlGaN) and a Schottky layer 105 made of undoped aluminum gallium nitride are sequentially deposited on a substrate 101 made of a sapphire substrate, where a two-dimensional electron gas layer made of a potential well and having an extremely high electron mobility is formed in the vicinity of the interface where the channel layer 103 and the charge supply layer 104 form a hetero junction. In the semiconductor device having such a structure, a voltage that is applied to a gate electrode 106 (control electrode) that makes Schottky contact with the Schottky layer 105 is controlled, and thereby, carriers (two-dimensional electron gas) that flow between a source electrode 107a and a drain electrode 107b (ohmic electrode) are controlled. As described above, in the conventional semiconductor device, the source electrode 107a and the drain electrode 107b are formed on the Schottky layer 105 made of undoped aluminum gallium nitride.

In the semiconductor device of this type, there have been proposed various structures disclosed in, for example, Japanese Unexamined Patent Publication No. 335637/1998, in addition to the above described structure.

SUMMARY OF THE INVENTION

In a conventional nitride semiconductor device, ohmic electrodes are generally formed on undoped aluminum gallium nitride of which the specific contact resistivity is approximately $1 \times 10^{-5}$ $\Omega \cdot cm^2$. Meanwhile, in a GaAs-based semiconductor device, the specific contact resistivity of ohmic electrodes is generally at a level of $10^{-6}$ $\Omega \cdot cm^2$, and the specific contact resistivity of a nitride semiconductor device is higher by approximately one digit; therefore, the nitride semiconductor device exhibits poorer properties. In order to achieve an increase in performance of a device for high frequency and high output that uses a nitride semiconductor device, an improvement in the properties of the resistance is required. An object of the present invention is to provide a nitride semiconductor device with ohmic electrodes having a low contact resistance, and a manufacturing method thereof.

In order to achieve the above-described object, the invention of the present application provides a nitride semiconductor device made of a III-V group nitride semiconductor layer which is formed of a III group element made of at least one from among the group consisting of gallium, aluminum, boron and indium, and a V group element including at least nitrogen from among the group consisting of nitrogen, phosphorous and arsenic, and the nitride semiconductor device comprises: a first nitride semiconductor layer made of the III-V group nitride semiconductor layer that has been deposited on a substrate; a second nitride semiconductor layer that does not include aluminum and is made of the III-V group nitride semiconductor layer which has been deposited on the first nitride semiconductor layer and of which the film formation temperature is lower than that of the first nitride semiconductor layer; and an electrode that makes ohmic contact with the second nitride semiconductor layer, wherein the electrode makes contact with the second nitride semiconductor layer in the state of being in film form.

The invention of the present application further provides a nitride semiconductor device made of a III-V group nitride semiconductor layer which is formed of a III group element made of at least one from among the group consisting of gallium, aluminum, boron and indium, and a V group element including at least nitrogen from among the group consisting of nitrogen, phosphorous and arsenic, and the nitride semiconductor device comprises: a first nitride semiconductor layer made of the III-V group nitride semiconductor layer that has been deposited on a substrate; a second nitride semiconductor layer that does not include aluminum and is made of the III-V group nitride semiconductor layer being crystallinity with minute grains which has been deposited on the first nitride semiconductor layer; and an electrode that makes ohmic contact with the second nitride semiconductor layer, wherein the electrode makes contact with the second nitride semiconductor layer being crystallinity with minute grains in the state of being in film form.

The invention of the present application, as a further feature, provides the nitride semiconductor device wherein the first nitride semiconductor layer is made of the III-V group nitride semiconductor layer that includes aluminum.

According to an additional feature of the invention the nitride semiconductor device comprises a third nitride semiconductor layer made of the III-V group nitride semiconductor layer which has an energy gap that is smaller than the energy gap of the first nitride semiconductor layer between the substrate and the first nitride semiconductor layer.

A still further feature of the invention provides the nitride semiconductor device comprising a control electrode that forms a Schottky junction in the second nitride semiconductor layer or the first nitride semiconductor layer.

The invention of the present application provides a manufacturing method of a nitride semiconductor device made of a III-V group nitride semiconductor layer which is formed of a III group element made of at least one from among the group consisting of gallium, aluminum, boron and indium, and a V group element including at least nitrogen from among the group consisting of nitrogen, phosphorous and arsenic, and the manufacturing method comprises the steps of: forming a first nitride semiconductor layer made of the III-V group nitride semiconductor layer on a substrate; forming a second nitride semiconductor layer being crystallinity with minute grains that is made of the III-V group nitride semiconductor layer and does not include aluminum at a temperature lower than the film formation temperature at the time when the first nitride semiconductor layer is formed on the first nitride semiconductor layer; and forming a metal pattern that makes ohmic contact with the second nitride semiconductor layer being crystallinity with minute grains after the film formation and carrying out heat treatment so as to form an ohmic electrode.

According to the present invention, an ohmic electrode is formed on a nitride semiconductor layer which does not include aluminum and which retains crystallinity with minute grains after film formation, where no process such as implantation of impurity ions is carried out, so that it is possible to obtain a semiconductor device with an ohmic electrode having a low specific contact resistivity (at a level of $10^{-6}$ Ω·cm$^2$) where a metal that forms the ohmic electrode infiltrates into the borders of grains of a microscopic crystal of a nitride semiconductor.

In addition, a desired nitride semiconductor device can be formed of a nitride semiconductor layer being such crystallinity with minute grains only by controlling the temperature for epitaxial growth in the manufacturing process of a conventional semiconductor device, so that the manufacturing process can be easily controlled, and a nitride semiconductor device having excellent properties can be manufactured with a high yield.

DETAILED DESCRIPTION

In the following, a nitride semiconductor device according to the present invention will be described in detail.

Embodiment 1

Figure 1:
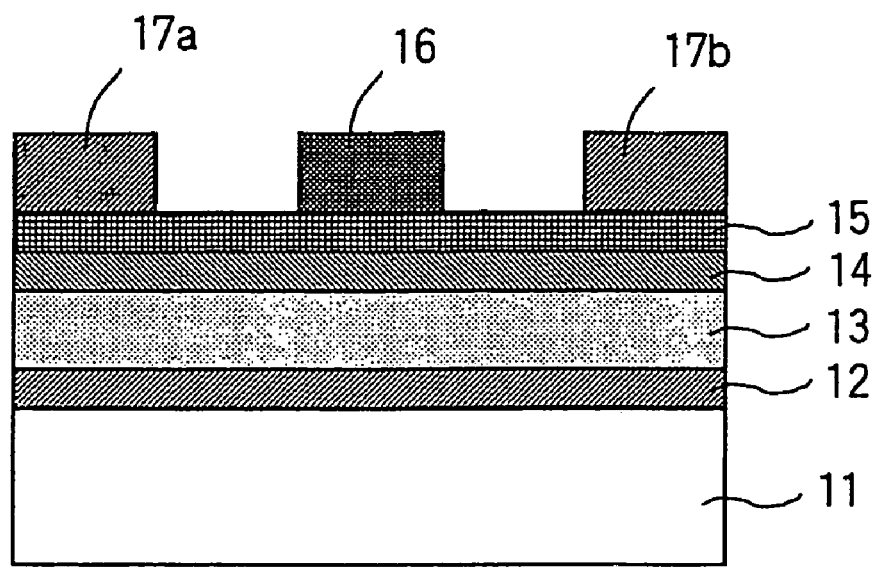
FIG. 1 is an explanation view of a nitride semiconductor device of Embodiment 1.

As shown in FIG. 1, a buffer layer 12 made of aluminum nitride (AlN) having a thickness of approximately 100 nm, a channel layer 13 made of undoped gallium nitride (GaN) having an energy gap that is smaller than the energy gap of a charge supply layer (to be described later) and having a thickness of 2 μm, a charge supply layer 14 made of an n-type aluminum gallium nitride (AlGaN) having a thickness of 15 nm which forms a two-dimensional electron gas layer that becomes a carrier in the interface with the channel layer 13, and a Schottky layer 15 made of undoped gallium nitride (GaN) being crystallinity with minute grains (crystallites) and having a thickness of 10 nm are formed and deposited on a substrate 11 made of silicon carbide (SiC). A source electrode 17a and a drain electrode 17b (ohmic electrode) made of a deposited body of titanium (Ti)/aluminum (Al)/titanium (Ti)/gold (Au) are formed on the Schottky layer 15, and make ohmic contact on the charge supply layer 14. No special process such as implantation of impurity ions or etching is carried out on the Schottky layer 15 where the ohmic contact is made after the film formation thereof, so that the crystallinity with minute grains after the film formation is maintained as it is. Furthermore, a gate electrode 16 made of a deposited body of nickel (Ni)/gold (Au) is formed on the Schottky layer 15 so as to form a Schottky junction on the Schottky layer 15.

The Schottky layer 15 on which an ohmic electrode is formed is crystallinity with minute grains; therefore, a metal that forms the ohmic electrode infiltrates into the borders of the grains of the microscopic crystal, so that an ohmic electrode having a low contact resistance can be obtained.

Embodiment 2

Figure 2:
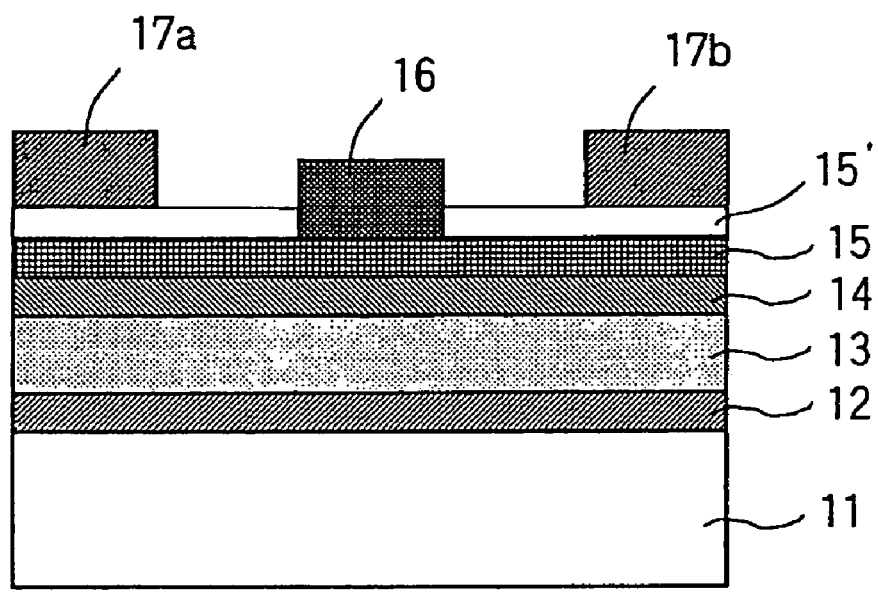
FIG. 2 is an explanation view of a nitride semiconductor device of Embodiment 2.

FIG. 2 is a cross-sectional view of a HEMT which is a III-V group nitride semiconductor device according to Embodiment 2 of the present invention. As shown in FIG. 2, a buffer layer 12 made of gallium nitride (GaN) having a thickness of approximately 30 nm that has been grown at a low temperature, a channel layer 13 made of undoped gallium nitride (GaN) having a thickness of 2 μm and an energy gap that is smaller than the energy gap of a charge supply layer, which is mentioned in following, a charge supply layer 14 made of an n-type aluminum gallium nitride (AlGaN) having a thickness of 15 nm where a two dimensional electron gas layer that becomes a carrier is formed in the interface with the channel layer 13, a Schottky layer 15 made of undoped aluminum gallium nitride (AlGaN) having a thickness of 3 nm, and a cap layer 15' made of undoped gallium nitride (GaN) being crystallinity with minute grains and a thickness of 10 nm are formed and deposited on a substrate 11 made of sapphire. A part of the cap layer 15' is removed through etching so as to form a recess, and a gate electrode 16 made of a deposited body of titanium (Ti)/platinum (Pt)/gold (Au) or a deposited body of nickel (Ni)/gold (Au) is formed on the Schottky layer 15 of which the surface has been exposed in the recess; thus, the gate electrode 16 makes Schottky contact on the Schottky layer 15. A source electrode 17a and a drain electrode 17b are formed of titanium (Ti)/aluminum (Al) so as to make ohmic contact on the cap layer 15'.

Embodiment 3

Figure 3A:
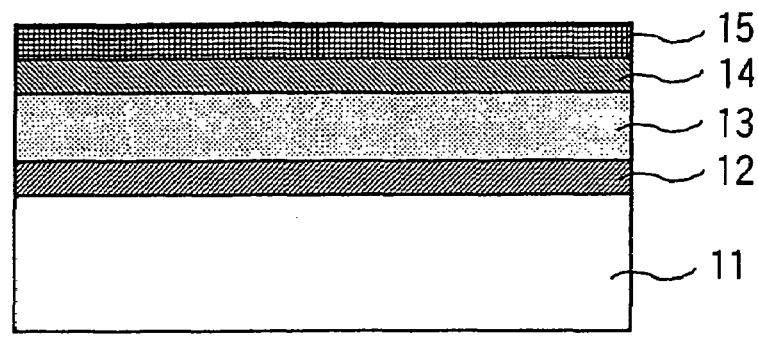
FIGS. 3(a), 3(b) and 3(c) are respective explanation views of a manufacturing method of a nitride semiconductor device of Embodiment 3.
Figure 3B:
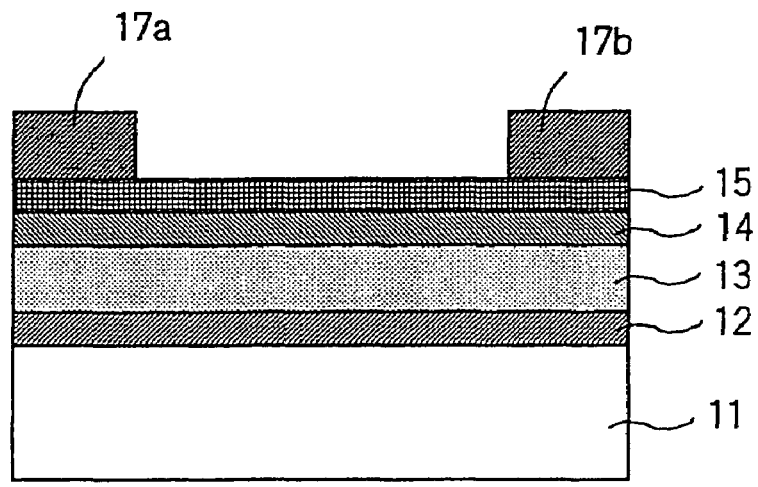
Figure 3C:
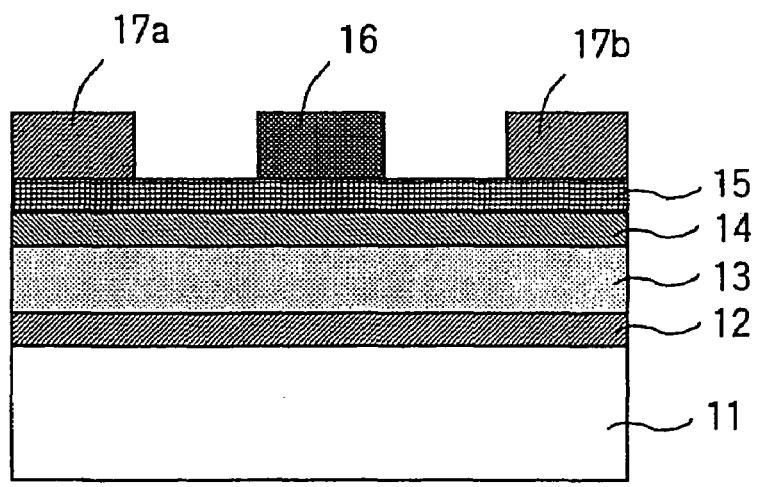

Then, with reference to FIGS. 3(a) to 3(c), a manufacturing method of the nitride semiconductor device shown in FIG. 1 will be described in detail. First, a buffer layer 12 made of aluminum nitride (AlN) having a thickness of approximately 100 nm is grown on a substrate 11 made of silicon carbide (SiC) according to an MOCVD (Metal Organic Chemical Vapor Deposition) method or an MBE (Molecular Beam Epitaxy) method. Next, a channel layer 13 made of undoped gallium nitride (GaN) having a thickness of 2 μm and a charge supply layer 14 made of n-type aluminum gallium nitride (AlGaN) having a thickness of 15 nm that forms a two-dimensional electron gas layer that becomes a carrier in the interface with the channel layer 13 are sequentially grown and deposited when the temperature of the substrate is 1080° C. After that, a Schottky layer 15 made of undoped gallium nitride (GaN) having a thickness of 10 nm is grown when the temperature of the substrate is 550° C. The Schottky layer 15 is grown when the temperature of the substrate is low, as described above, so that the Schottky layer 15 has crystallinity with minute grains (FIG. 3(a)).

A deposited body that forms an ohmic electrode is deposited directly on the Schottky layer 15 after being grown according to a conventional lithographic method and lift-off method. More specifically, a titanium (Ti) film having a thickness of 20 nm, an aluminum (Al) film having a thickness of 200 nm, a titanium (Ti) film having a thickness of 50 nm and a gold (Au) film having a thickness of 300 nm are deposited and patterned, after which heat treatment is carried out in a nitride atmosphere at 800° C. for 30 seconds; thus, a source electrode 17a and a drain electrode 17b are formed so as to make ohmic contact with the Schottky layer 15 and the charge supply layer 14 (FIG. 3(b)). Here, according to the present invention, no special process is carried out on the surface of the Schottky layer 15 in order to make ohmic contact. That is, only a cleaning process that is conventionally carried out in a semiconductor manufacturing process is carried out, and no implantation of impurity ions or etching is carried out on the surface of the Schottky layer 15, and the ohmic electrodes are directly formed on the surface of the Schottky layer 15 being crystallinity with minute grains.

Next, a nickel (Ni) film having a thickness of 20 nm and a gold (Au) film having a thickness of 500 nm are deposited on the Schottky layer 15 according to a conventional lithographic method and lift-off method, and are patterned, so that a gate electrode 16 is formed so as to make Schottky contact with the Schottky layer 15 (FIG. 3(*c*)). After that, a HEMT is completed in accordance with a manufacturing process for a conventional semiconductor device.

Embodiment 4

Then, a manufacturing method of the nitride semiconductor device shown in FIG. 2 will be described in detail. First, a buffer layer 12 made of gallium nitride (GaN) having a thickness of approximately 30 nm is grown on a substrate 11 made of sapphire according to an MOCVD (Metal Organic Chemical Vapor Deposition) method or an MBE (Molecular Beam Epitaxy) method. Next, a channel layer 13 made of undoped gallium nitride (GaN) having a thickness of 2 μm, a charge supply layer 14 made of n-type aluminum gallium nitride (AlGaN) having a thickness of 15 nm that forms a two-dimensional electron gas layer that becomes a carrier in the interface with the channel layer 13, and a Schottky layer 15 made of undoped aluminum gallium nitride (AlGaN) having a thickness of 3 nm are sequentially grown and deposited when the temperature of the substrate is 1080° C. After that, a cap layer 15' made of undoped gallium nitride (GaN) having a thickness of 10 nm is grown when the temperature of the substrate is 550° C. The cap layer 15' is grown when the temperature of the substrate is low, as described above, so that the cap layer 15' has crystallinity with minute grains.

A deposited body that forms an ohmic electrode is directly deposited on the cap layer 15' after being grown according to a conventional lithographic method and lift-off method. More specifically, a titanium (Ti) film having a thickness of 20 nm and an aluminum (Al) film having a thickness of 200 nm are deposited and patterned, after which heat treatment is carried out in a nitrogen atmosphere at 800° C. for 30 seconds, so that a source electrode 17*a* and a drain electrode 17*b* are formed so as to make ohmic contact with the Schottky layer 15 and the charge supply layer 14. Here, according to the present invention, no special process is carried out on the surface of the cap layer 15' in order to make ohmic contact. That is, only a cleaning process that is conventionally carried out in a semiconductor manufacturing process is carried out, and no implantation of impurity ions or etching is carried out on the surface of the cap layer 15', and the ohmic electrodes are directly formed on the surface of the cap layer 15' being crystallinity with minute grains.

Next, a part of the cap layer 15' is removed through etching according to a conventional lithographic method so as to form a recess, and a gate electrode 16 made of a deposited body of titanium (Ti)/platinum (Pt)/gold (Au) or a deposited body of nickel (Ni)/gold (Au) is formed on the Schottky layer 15 of which the surface has been exposed in the recess; thus, the gate electrode 16 makes Schottky contact with the Schottky layer 15. After that, a HEMT is completed in accordance with a manufacturing process for a conventional semiconductor device.

Figure 4:
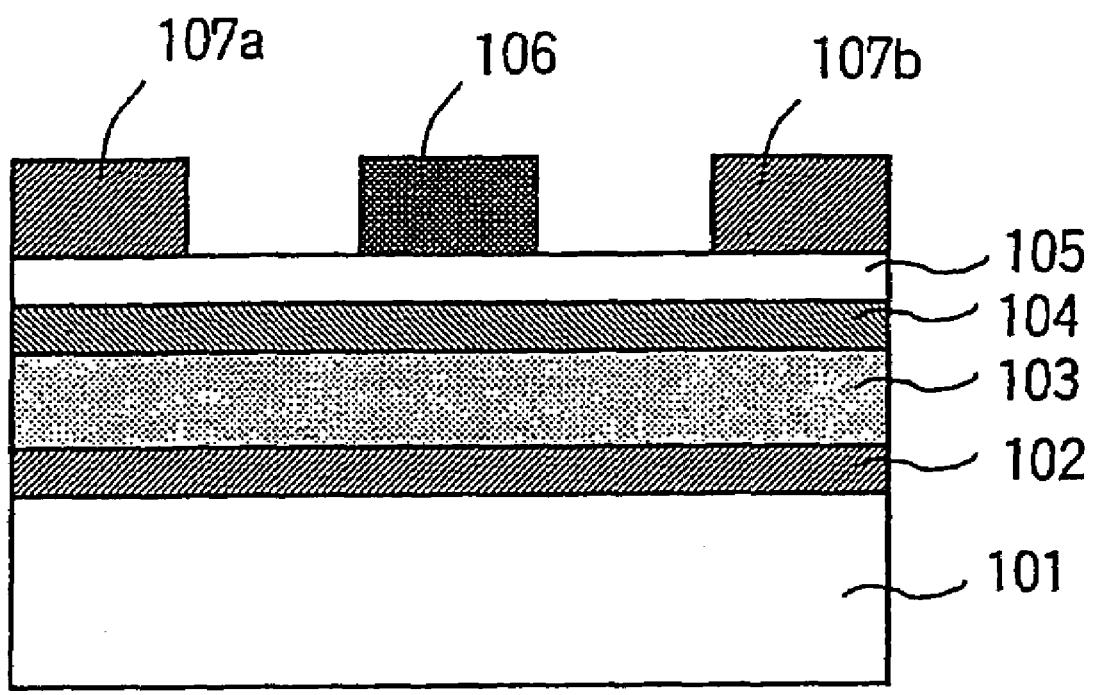
FIG. 4 is a cross sectional view of a semiconductor device made of a conventional III-V group nitride semiconductor.

Ohmic electrodes of a nitride semiconductor device that has been formed as described above were evaluated according to a TLM (Transmission Line Method). For the purpose of comparison, ohmic electrodes of the nitride semiconductor device according to the prior art shown in FIG. 4 were also measured in the same manner. As a result of this, it was found that the contact resistance according to the present invention is 0.04 Ω·cm, compared to 0.07 Ω·cm in the prior art, and the specific contact resistance according to the present invention is $2.6 \times 10^{-6}$ Ω·cm$^2$, compared to $1.1 \times 10^{-5}$ Ω·cm$^2$ in the prior art; thus, improvements in the respective properties were confirmed.

As described above, according to the present invention, ohmic electrodes are formed on a nitride semiconductor layer (second nitride semiconductor layer) being crystallinity with minute grains, and it can be confirmed that ohmic electrodes having properties equivalent to those of a GaAs-based semiconductor device can be formed.

Here, the present invention is not limited to the above-described Embodiments, but rather, a variety of modifications are possible. Instead of the nitride semiconductor of the HEMT structure, for example, an FET structure may be provided, where a nitride semiconductor layer to which impurities have been added is used for an active layer (channel layer) on which the above-described Schottky layer 15 is formed. In addition, the nitride semiconductor layer is not limited to a GaN/AlGaN-based layer, but rather, the second nitride semiconductor layer on which ohmic electrodes are formed can be formed of a layer that includes GaN, InN or a mixed crystal compound thereof and includes aluminum.

In addition, the composition of the electrodes that make ohmic contact with the second nitride semiconductor layer may be appropriately selected in accordance with the type of semiconductor layer used. In addition, the second nitride semiconductor layer exhibits high insulating properties, and the thickness thereof may be appropriately selected in accordance with the selected type of metal.

Here, though the second nitride semiconductor layer is described as that having crystallinity with minute grains, it is an aggregate of crystallinity with minute grains or a structure where these are rearranged, and the size or arrangement of crystal grains varies depending on the temperature during the growth, the composition of atmospheric gases at the time of the growth, the type of substrate on which the structure is grown and the like; therefore, the temperature during the growth can be controlled so as to obtain a second nitride semiconductor layer having desired properties.

What is claimed is:

1. A nitride semiconductor device for a field effect transistor, the nitride semiconductor device comprising:

a first nitride semiconductor layer made of a III-V group nitride semiconductor material which is formed of a III group element made of at least one from among the group consisting of gallium, aluminum, boron and indium, and a V group element including at least nitrogen from among the group consisting of nitrogen, phosphorous and arsenic, and that has been deposited on a substrate;

a second nitride semiconductor layer made of an undoped III-V group nitride semiconductor material which is formed of a III group element made of at least one from among the group consisting of gallium, boron and indium, and a V group element including at least nitrogen from among the group consisting of nitrogen, phosphorous and arsenic, and that has been deposited on the first nitride semiconductor layer and of which the film formation temperature is lower than that of said first nitride semiconductor layer such that the second nitride semiconductor layer has a crystallinity with crystallites; and an electrode that makes ohmic contact with the second nitride semiconductor layer which has a crystallinity with crystallites; and wherein said second nitride semiconductor layer is formed with a recess therein exposing said first nitride semiconductor layer for a control electrode to make Schottky contact with said first nitride semiconductor layer through said recess.

2. The nitride semiconductor device according to claim 1, wherein said first nitride semiconductor layer includes aluminum.

3. The nitride semiconductor device according to claim 1, further comprising a third nitride semiconductor layer made of a III-V group nitride semiconductor material which is formed of a III group element made of at least one from among the group consisting of gallium, aluminum, boron and indium, and a V group element including at least nitrogen from among the group consisting of nitrogen, phosphorous and arsenic, and which has an energy gap that is smaller than the energy gap of the material of said first nitride semiconductor layer, said third layer being located between said substrate and said first nitride semiconductor layer.

4. The nitride semiconductor device according to claim 1, wherein the ohmic electrode has a specific contact resistivity at a level of $10^{-6}$ $\Omega \cdot cm^2$.

5. The nitride semiconductor device according to claim 4, wherein the ohmic electrode infiltrates into the border of the grains of a microscopic crystal of said second nitride semiconductor layer.

* * * * *